United States Patent
Chesarek et al.

[11] Patent Number: 5,917,371
[45] Date of Patent: Jun. 29, 1999

[54] SIGNAL FEED MATRIX AMPLIFIER REDUCTION SYSTEM AND METHOD

[75] Inventors: Richard Chesarek; Eric Drucker, both of Seattle, Wash.

[73] Assignee: Metawave Communications Corporation, Redmond, Wash.

[21] Appl. No.: 08/901,932

[22] Filed: Jul. 29, 1997

[51] Int. Cl.[6] ........................................ H03F 3/68
[52] U.S. Cl. ........................ 330/124 R; 330/53
[58] Field of Search ............... 330/124 R, 126, 330/295, 84, 124 D, 286, 53; 333/117, 120, 123

[56] References Cited

U.S. PATENT DOCUMENTS

| | | | |
|---|---|---|---|
| 4,618,831 | 10/1986 | Egami et al. | 330/124 R |
| 4,644,301 | 2/1987 | Hecht | 330/124 D |
| 5,373,299 | 12/1994 | Ozaki et al. | 342/373 |
| 5,604,462 | 2/1997 | Gans et al. | 330/124 R |
| 5,675,285 | 10/1997 | Winters | 330/295 |
| 5,790,517 | 8/1998 | Meredith | 370/210 |

OTHER PUBLICATIONS

Butler Network Extension to any Number of Antenna Ports: Article appearing in IEEE *Transactions on Antennas and Propagation*, Nov., 1970 by H.E. Foster et al., pp. 818–820.

*Primary Examiner*—Robert Pascal
*Assistant Examiner*—Khanh Van Nguyen
*Attorney, Agent, or Firm*—Fulbright & Jaworski L.L.P.

[57] ABSTRACT

A system and method for providing distributed amplification of a plurality of input signals is disclosed. The preferred embodiment of the disclosed invention utilizes two signal path matrixes having signal combiners, hybrid combiners, and phase shifters to dissect an input signal for amplification and subsequent recombination. The unique matrixes disclosed provide for the distributed amplification of any number of input signals factorable as a product of prime numbers including an odd prime number factor, therefore reducing the number of linear power amplifiers required where a number of input signals other than a power of two are used.

54 Claims, 8 Drawing Sheets

SIGNAL FEED MATRIX AMPLIFIER REDUCTION SYSTEM AND METHOD

RELATED APPLICATIONS

The present application is being concurrently filed with U.S. application Ser. No. 08/902,057, entitled "SIGNAL FEED MATRIX LPA REDUCTION SYSTEM AND METHOD", having a common assignee, which application is hereby incorporated by reference.

TECHNICAL FIELD OF THE INVENTION

This invention relates to a signal power amplification system and more particularly to a system and method for equally distributing the input signals across a set of power amplifiers in a signal feed matrix while maintaining the desired power distribution, beam forming, and signal quality.

BACKGROUND OF THE INVENTION

It is common in the art to utilize an antenna array comprised of a plurality of antenna elements in order to illuminate a selected area with a signal or signals. Often such an array is used in combination with beam forming techniques, such as phase shifting the signal associated with particular antenna elements of the array, such that the signals from the excited elements combine to form a desired beam, or radiation pattern, having a predetermined shape and/or direction. Similarly, the antenna elements of such an array may each provide illumination of a select area, or sector, of the array's total radiation pattern, thus providing designated signals to a selected area.

Irrespective of their use to provide adaptive techniques or to provide signal coverage within a sector, these antenna elements must typically be provided signals having some component unique to the particular antenna element for which it is to excite. For example, where the array utilizes beam steering, adjacent antenna elements may each be provided with a signal having common information content but phase shifted in order to form a desired composite radiated signal. Likewise, where the array utilizes the individual antenna elements to provide signals within selected sectors, only those antenna elements associated with particular sectors need be provided with a signal (i.e., the power component of the signal at an antenna element associated with an unused sector may be zero).

Therefore, it is often desirable to provide signal input paths sufficient in number to result in the controllable excitation of the antenna columns as described above. For example, where sixteen antenna elements are to be utilized in an array, sixteen signal input paths, each associated with a particular antenna element, may be utilized.

In addition to the ability to apply a selected signal to particular ones of the antenna elements, in order to provide a signal of sufficient amplitude, it is often desirable to provide amplification in each of the signal input paths. One method of providing such signal amplification is to provide linear power amplifiers (LPA) in signal paths directly coupled to each antenna element. In our example, having sixteen signal input paths associated with sixteen antenna elements, this method requires sixteen LPAs, or one LPA coupled to each antenna element.

However, LPAs are expensive and often cumbersome to implement. For example, they are relatively heavy and therefore often difficult to deploy in a typical antenna system environment. Similarly, the LPAs are active components consuming power and producing heat as a by-product and are susceptible to failure. Therefore, it is desirable to both reduce the number of LPAs necessary for any particular antenna configuration, as well as to provide for signal transmission to any antenna element even in the case of an inoperative LPA.

An alternative method of providing amplified signals to the antenna elements of an array uses a back to back Butler matrix combination having sixteen LPAs disposed between a Butler matrix and an inverse Butler matrix to provide a distributed amplifier arrangement. The advantage of this arrangement is that a Butler matrix takes a signal input at any of the matrix's inputs and effectively provides a Fourier transform of the signal. This results in an input signal, provided to a single input of the Butler matrix, appearing at each of the matrix's outputs as a linear phase progression (i.e., the input signal is dissected into spectral components each appearing at a different Butler matrix output). By amplifying each of these spectral component signals, and applying the result to an inverse Butler matrix, an amplified version of the original signal, including all of its spectral components, may be had.

Similarly, a back to back hybrid matrix combination having sixteen LPAs disposed between a hybrid matrix and an inverse hybrid matrix providing a distributed amplifier arrangement may be used. Although not a Fourier transform, the input signal is nonetheless provided to each of the matrix's outputs (here, because of the phase shift relationship of the hybrid splitters used, the signals appearing at the hybrid matrix's output are component signals having a phase difference equal to that of the hybrid splitter as between adjacent signal components). As such, by amplifying each of these power component signals, and applying the result to an inverse hybrid matrix, an amplified version of the original signal results. The use of such a hybrid matrix combination is often preferable to the aforementioned Butler matrix combination as the cost associated with a hybrid matrix is considerably lower than that of the Butler matrix.

One advantage of the above described back to back Butler and hybrid matrix arrangements is that, by definition, the arrangements provide distributed amplification of any input signal (i.e., a signal input at any single input signal path is evenly distributed across all LPAs). As such, the arrangements provide advantages of distributed amplification, such as amplifier operation in a more linear range as well as fault tolerance for an inoperative LPA.

In contrast to this matrix arrangement, the directly coupled LPA method of providing amplification, described above, must supply all gain associated with any signal through a single amplifier, or series of amplifiers having a single signal path. It becomes readily apparent that such an arrangement provides no fault tolerance for an LPA failure. As the LPAs are simply disposed directly between the signal input path and an associated antenna element, if an LPA fails then the signal path is disrupted and the associated antenna element is no longer provided a signal.

However, in the matrix arrangements, if one or even a number of the LPAs malfunction it is still conceivable that performance may be had from all of the antenna elements. This is so because the first Butler or hybrid matrix distributes components of the input signal along its output. These components are then each amplified by the LPAs and subsequently recombined by the inverse Butler or hybrid matrix to reconstruct the original signal. Accordingly, if a few of the signal components are missing, such as due to failure of one or more of the LPAs, the inverse matrix can still reconstruct the signal fairly accurately. The reconstructed signal is not an exact reproduction of the original signal, but is accurate enough to provide a signal to the right antenna element.

However, it shall be appreciated that, although providing a desired advantage of fault tolerance, it is very difficult, if not impossible, to configure either the back to back Butler or hybrid matrix to provide for input and output signal paths of numbers different than those of the power two (i.e., typical back to back Butler and hybrid matrixes are limited to inputs and outputs numbering 4, 8, 16, . . . $2^n$). Because of this limitation, use of a number of antenna elements differing from a power of two requires a Butler or hybrid matrix having more input and output signal paths than actually utilized. For example, an antenna array having only twelve antenna elements must use a 16×16 Butler matrix while only utilizing twelve of the input and twelve of the output paths.

Although the above arrangement will satisfactorily provide the advantages of distributed amplification, it should be appreciated that, because the matrix arrangement distributes any input signal as signal components among all its outputs, a total of sixteen LPAs are required. As described above, it is desirable to reduce the number of LPAs necessary to provide the desired signal to an antenna array. However, where the number of antenna elements is other than a power of two, a distributed amplifier utilizing a back to back matrix arrangement actually requires more LPAs than there are input signals or antenna elements.

Therefore, a need exists in the art for a system and method by which various numbers of input signals associated with an antenna array or other system may be amplified while providing the advantages of a distributed amplifier.

A further need exists in the art for a system and method providing for the distributed amplification of numbers of signals other than powers of two while requiring a minimum number of amplifiers.

A still further need exists in the art for providing suitable fault tolerance in the amplification of a number of signals.

SUMMARY OF THE INVENTION

These and other objects and advantages are present in a system and method utilizing a novel arrangement of phase delays, splitters and combiners in combination with LPAs to provide distributed amplification. Accordingly, a first (splitter) and second (combiner) distinct matrix, as opposed to a hybrid matrix and inverted hybrid matrix or back to back Butler matrix, supply signals to and from a number of LPAs. However, because of the novel arrangement of the individual components comprising the first and second matrix, the present invention is not limited to numbers of input signal paths related to powers of two (i.e., $2^n$). Instead, the present invention may be utilized to provide distributed amplification of any number of inputs factorable into prime factors (i.e., any number) For example, where N is the number of inputs and outputs of the inventive distributed amplifier, $N=(n_1)(n_2) \ldots (n_k)$, where $n_i$ are prime factors of N (i.e., 9 inputs/outputs are possible as 9=(3)(3), 15 inputs/outputs are possible as 15=(3)(5), and 12 inputs/outputs are possible as 12=(2)(2)(3), and 20 inputs/outputs are possible as 20=(2)(2)(5)). As such, the present invention utilizes fewer LPAs where the number of inputs/outputs desired is other than a power of two. Of course, the present invention may be used to replace any number of multiple amplifier applications with the inventive amplifier matrixes disclosed herein.

Moreover, the novel design of the first and second matrixes provides a portion of a signal associated with any particular signal input path to every LPA of the distributed amplifier independent of the number of inputs/outputs. Therefore, the present invention provides LPA fault tolerance by being able to maintain a signal at any output even where one or more LPA is inoperative. However, because each LPA is utilized in the amplification of a portion of each input signal, regardless of the particular input upon which the input signal appears, the failure of any LPA will have at least a marginal effect upon each output signal. Of course, as the amplification of any input signal is distributed among all the LPAs of the distributed amplifier, the failure of any one LPA results in signal degradation inversely proportional to the number of LPAs in the system. Thus, the more LPAs included in a particular system, the less significant the impact of a failure of any one LPA. Therefore, the present invention maximizes LPA fault tolerance while minimizing the number of LPA, required for particular number of inputs/outputs.

Therefore, one technical advantage of the present invention is that distributed signal manipulation may be provided for a number of input/output signal paths not limited to a power of two while maintaining a minimum number of signal manipulation devices.

A further technical advantage of the present invention is that distributed signal manipulation may be provided for an odd number of input/output signal paths while maintaining a minimum number of signal manipulation devices.

A still further technical advantage of the present invention is provision of system fault tolerance in that the failure of any one signal manipulation device does not result in the preclusion of a signal at any one signal output.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A shows to the input matrix and FIG. 3B shows the output matrix;

FIGS. 4A and 4B show the input matrix and FIGS. 4C and 4D show the output matrix;

DESCRIPTION OF THE PREFERRED EMBODIMENTS

In order to better understand the features and advantages of the present invention, reference is made to prior art back to back matrix distributed amplifier systems. Directing attention to FIG. 1, a back to back matrix for providing distributed amplification of signals input at inputs 101a–101p, via amplifiers 110a–110p, to outputs 102a–102p is shown. Here matrix 120, a 16×16 matrix which may be a Butler or hybrid matrix, distributes any signal appearing at inputs 101a–101p across all the amplifiers 110a–110p coupled to the outputs of matrix 120. For example, a signal provided to input 101a, $A_0$, will be distributed by matrix 120 as signal components to each of amplifiers 110a–110p.

After amplification by amplifiers 110a–110p, the amplified signal components are provided to inputs of inverse matrix 130, a 16×16 matrix providing signal paths inverse to those of matrix 120. Inverse matrix 130 recombines the signal components to form an amplified version of the original signal. In our example, inverse matrix 130 provides an amplified version of the input signal $A_0$ as $P(A_0)$ at output 102a, where P is the gain factor of distributed amplifiers 110a–110p.

Figure 1:
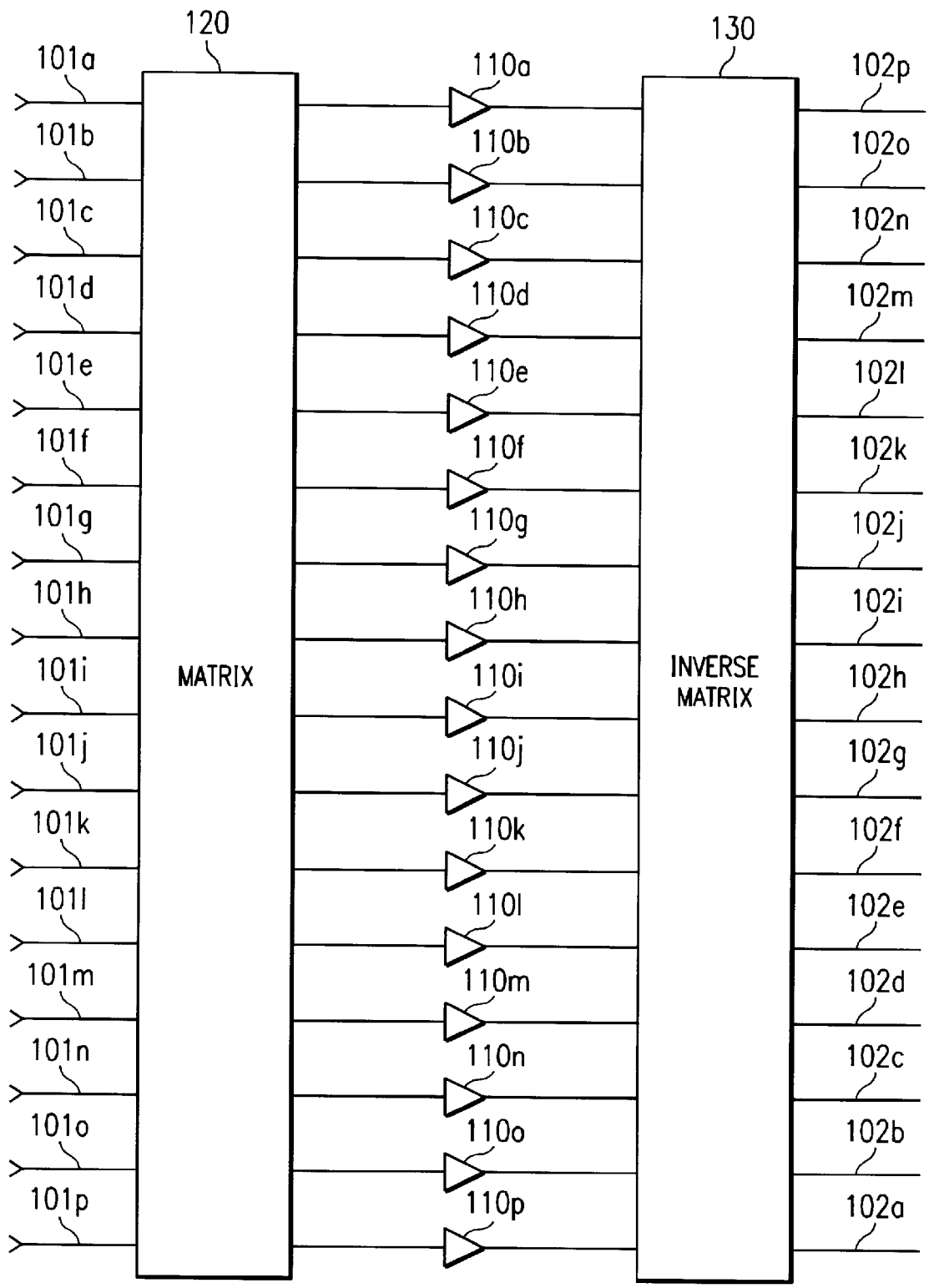
FIG. 1 shows a typical prior art distributed amplifier apparatus.
Figure 2:
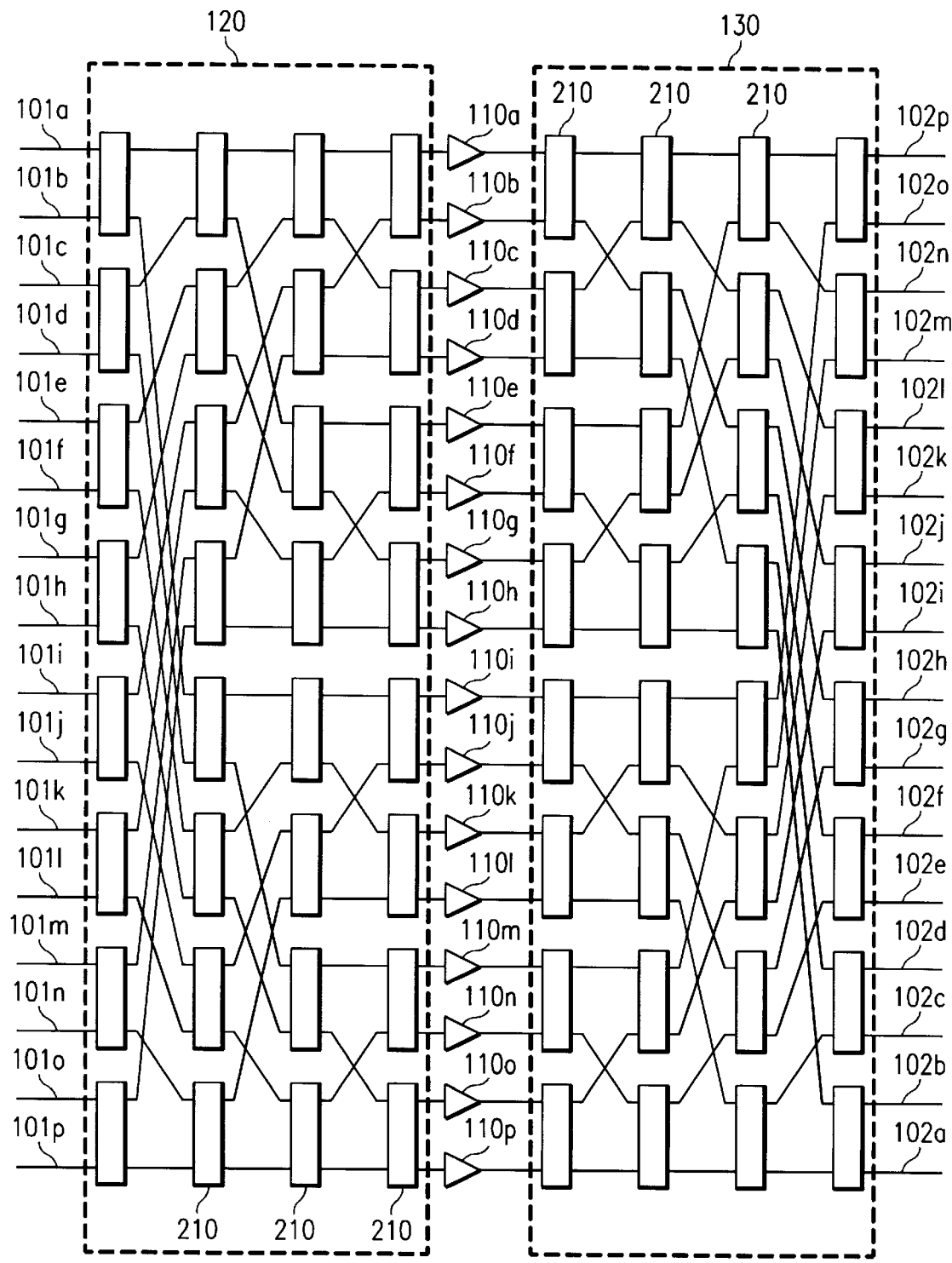
FIG. 2 shows the prior art distributed amplifier apparatus of FIG. 1 utilizing hybrid and inverted hybrid matrixes.

Directing attention to FIG. 2, the back to back matrix distributed amplification system of FIG. 1 is shown utilizing a four stage hybrid matrix in combination with a complementary four stage inverted hybrid matrix. Here 90° hybrid combiners 210 having predetermined interconnections provide dissection of input signals in matrix 120, while hybrid combiners 210 of inverse matrix 130, having interconnections inverse of those in matrix 120, provide recombination of the dissected input signal. It shall be appreciated that, although the components used and signal paths associated therewith are different than those shown, a back to back Butler matrix arrangement (not shown) operates to dissect and recombine input signals much the same as the hybrid matrix illustrated.

By tracing the signal paths associated with the particular hybrid combiners through which any particular input signal must pass, it becomes readily apparent that any signal associated with any input 101a–101p will be provided to each amplifier 110a–110p. Therefore, in our example, the output signal $P(A_0)$ at output 102a will include components amplified by each of amplifiers 110a–110p.

In either of these back to back matrix arrangements, by applying a signal to one input of the first matrix, such as input 101a, while terminating all other input signals and measuring the output of the sixteen ports of the inverse matrix, ideally the output will consist of a signal on one port, output 102a, and no signal on the other ports. Of course in practice this is not quite true because there is coupling between the ports, nevertheless it is a very good approximation. Similarly, other input ports on the first matrix can be excited with all other port terminated and the outputs of the inverse matrix can be measured.

From measuring such input signals, a 16×16 square matrix can be constructed which represents the output signal levels of the sixteen output ports in response to excitations on each of the sixteen input ports. Ideally, the matrix will be a diagonal matrix, which means on its diagonal it will be all ones and all the other values in matrix will be zero. The ones meaning that the output signals correspond exactly to the input signal or, where other than unity gain is provided by the amplifiers, is equal to the input signal times the gain provided by the distributed linear power amplifiers. Assuming the gain provided by the distributed linear power amplifiers is one, or unity, for simplicity, the output will be equal to the corresponding input with each amplifier providing a portion of the output signal.

As such, even when interfaced with a system utilizing a subset of inputs 101a–101p, and therefore also utilizing a subset of outputs 102a–102p, each amplifier 110a–110p is required. For example, where the back 130 to back matrix of FIG. 1 is to be utilized in a system having only twelve inputs and outputs, inputs 101a–101l may be utilized while ignoring inputs 101m–101p (the number of the inputs and outputs required may vary based, for example, on a number of individual antenna elements of an array depending on such design constraints as a desired composite beam width, antenna gain, or the like). However, following the signal paths illustrated in FIG. 2, it becomes readily apparent that, although output signals will be associated only with outputs 102a–102l, each amplifier 110a–110p is utilized.

Utilizing sixteen amplifiers for providing twelve discrete signals is typically undesirable as such amplifiers are generally expensive in addition to the deployment and operational issues associated therewith. As such, it is preferable to reduce the number of amplifiers while still maintaining the benefits of distributed amplification.

However, one of ordinary skill in the art will appreciate that prior art back to back Butler and hybrid matrixes utilized in such distributed amplifiers are limited to implementations having inputs and outputs numbering in a power of two, such as the 16×16 ($2^4$) hybrid matrix of FIG. 2. Therefore, a system requiring only twelve inputs and outputs, or any other number not equating to a power of two, must utilize a number of amplifiers in excess to the number of inputs and outputs when utilizing prior art systems.

A preferred embodiment of the present invention utilizes matrixes that, although dissecting input signals for provision to all amplifiers, does not require a number of amplifiers in excess to the number of discrete inputs and outputs utilized, regardless of each of such inputs and outputs numbering other than a power of two. It shall be appreciated that such an embodiment does not simply manipulate the number of amplifiers utilized by a prior art matrix, such as by removing those in number greater than the number of inputs or by combining signals initially divided for provision to multiple amplifiers (each of which techniques affect the relationship of 130 signal components and thus the quality of the recombined signal), in order to provide distributed amplification of a 12×12 matrix using only twelve amplifiers. Instead, the present invention provides inventive matrixes for division and recombination of signals to provide distributed amplification with a number of amplifiers other than a power of two.

Directing attention to FIGS. 4A through 4D, a 12×12 distributed amplifier matrix according to a preferred embodiment of the present invention is shown. Here input (splitter) matrix 420, shown in FIGS. 4A and 4B, and output (combiner) matrix 430, shown in FIGS. 4C and 4D, utilize hybrid combiners 410, three way splitters 435, three way combiners 440, and phase shifters 450–468 coupled in an inventive way so as to provide distributed amplification utilizing a number of amplifiers other than a power of two. Combiners 410 produce outputs with a 180 degree phase shift.

Of course, although the use of hybrid and combiners is discussed herein, it shall be appreciated that any number of components which may alone, or in combination, provide the signal splitting/combining with the appropriate phase shifting, as taught herein, may be utilized according to the present invention.

It shall be appreciated that the amount of phase shift introduced by each of the phase shifters 450–468 is predetermined so as to provide properly phased signal components to result in the desired summing and canceling of signal components. Specifically, the phase shift of the identified phase shifters is as set forth below wherein a positive phase value represents a phase delay and a negative phase value represents a phase advance:

Preferred Embodiment Phase Shifts

| Reference Numeral | Phase Shift in Degrees |
| --- | --- |
| 450 | 30 |
| 451 | 60 |
| 452 | 90 |
| 453 | 120 |
| 454 | 150 |
| 457 | 240 |
| 461 | −30 |
| 462 | −60 |
| 463 | −90 |
| 464 | −120 |
| 465 | −150 |
| 468 | −240 |

Figure 5A:
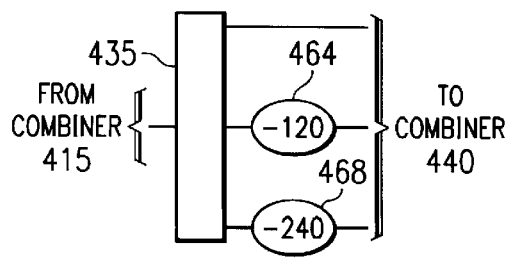
FIG. 5A shows a portion of the output matrix of FIG. 4C.
Figure 5B:
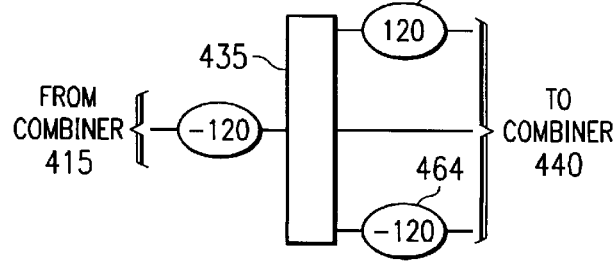
FIG. 5B shows an alternative arrangement of phase shifters of FIG. 5A.

Of course, although particular signal paths are identified as having predetermined phase shifts introduced by the use of the above mentioned phase shifters 450–468, it shall be appreciated that any combination of phase shifters introduced in any correspondingly appropriate signal path which results in the signal component phase relationships discussed herein may be used according to the present invention. For example, in the alternative embodiment of the arrangement of FIG. 5A, representing a portion of the combiner matrix of FIG. 4D, shown in FIG. 5B, phase shifter 464, and thus the phase shift of −120°, is placed in the signal path after hybrid combiner 415 and before splitter 435, originally having phase shifters 464 and 468 associated with its outputs. Accordingly, the corresponding phase shifters 464 and 468 of splitter 435 of FIG. 5A are replaced with the phase shifters to result in the appropriate phase shift. Phase shifter 468, having a phase shift of −240°, is replaced with phase shifter 464, having a phase shift of −120°, as shown. Likewise, phase shifter 464 of FIG. 5A is replaced by a short circuit (wire connection). Finally, phase shifter 453, having a phase shift of 120°, is added in the signal path previously having no phase shifter. It should be appreciated that, through insightful arrangement of these phase shifters, it is possible to reduce the number of phase shifters required or otherwise gain advantages, such as utilizing certain preferred phase shifters. For example, where a phase shifter is relocated, a remaining phase shifter may require adjustment resulting in a 0° or 360° phase shift and, thus, allow for the removal of this phase shifter entirely. Therefore, through strategic placement of the phase shifters, advantages may be realized, such as reducing the number required to achieve the present invention.

The phase shifters of the present invention may be any form of signal phase adjusting means. For example, mechanical phase shifters, such as a predetermined length of signal path, i.e., a predetermined length of coax cable, may be utilized to delay a signal a predetermined amount of time and, thus, introduce a particular phase shift. Mechanical phase shifters as used herein includes reflection type circuits, i.e., circular and hybrid coupled circuits, as well as transmission type circuits, i.e., fixed line, loaded line, and high pass low pass circuits. In addition to mechanical phase shifters, devices such as ferrite phase shifters, semiconductor device phase shifters, active FET phase shifters, bulk semiconductor phase shifters, and Microwave acoustic delay line (SAW) devices may be utilized. Providing a signal phase shift as utilized by the present invention is well known in the art and will not be discussed in detail herein. However, information with respect to such devices may be found in the book entitled "Microwave and Millimeter Wave Phase Shifters" by Shiban K. Koul and Bharathi Bhat, published by Artech Houst, Inc., copyright 1991, which book is incorporated herein by reference. Of course, rather than introducing a phase advance, the signal may be phase retarded by an appropriate amount to give the same net result (i.e., a phase advance of 270° may be realized by applying a phase delay of 90°; likewise a phase advance of 330° may be realized by applying a phase delay of 30°).

Like the aforementioned Butler and hybrid matrixes, input matrix 420 is utilized to dissect signals appearing at any of the twelve inputs 101a–101l for provision of signal components to amplifiers 110a–110l. Accordingly, a signal appearing at an input of input matrix 420 is provided to each of amplifiers 110a–110l for amplification. It shall be appreciated that, through the use of the combination of hybrid splitters and phase shifts of input matrix 420, an input signal provided to a single input of the input matrix appears at each of the matrix's outputs as phase shifted replicas of the input signal.

For example, by tracing the interconnections of hybrid combiners 410, splitters 435 and combiners 440 in input matrix 420, it becomes readily apparent that a portion of a signal appearing at input 101*a* is provided to each of amplifiers 110*a*–110*l*. Likewise, a signal appearing at input 101*e* is also provided to each of amplifiers 110*a*–110*l*. Advantages of the use of all of the available amplifiers for processing of any particular input signal will be discussed in more detail below.

As before in the above back to back Butler and hybrid matrixes, output matrix 430 is utilized to recombine amplified signal components in order to reconstruct amplified versions of the signals as appearing at inputs 101*a*–101*l*. Output matrix 430 comprises the same interconnection of hybrid combiners 410, splitters 435 and combiners 440 with the introduction of phase shifts in the signal paths which are the negatives of those of input matrix 420.

It shall be appreciated that the unique interconnection of components in combination with aforementioned phase shifts of the input and output matrixes of the preferred embodiment provide a distributed amplification matrix having inputs and outputs numbering twelve (i.e., a number not a power of two). Furthermore, as will be discussed in more detail hereinbelow, the present invention may be utilized to provide distributed amplification of any number of signal inputs and outputs factorable into prime factors.

Figure 4A:
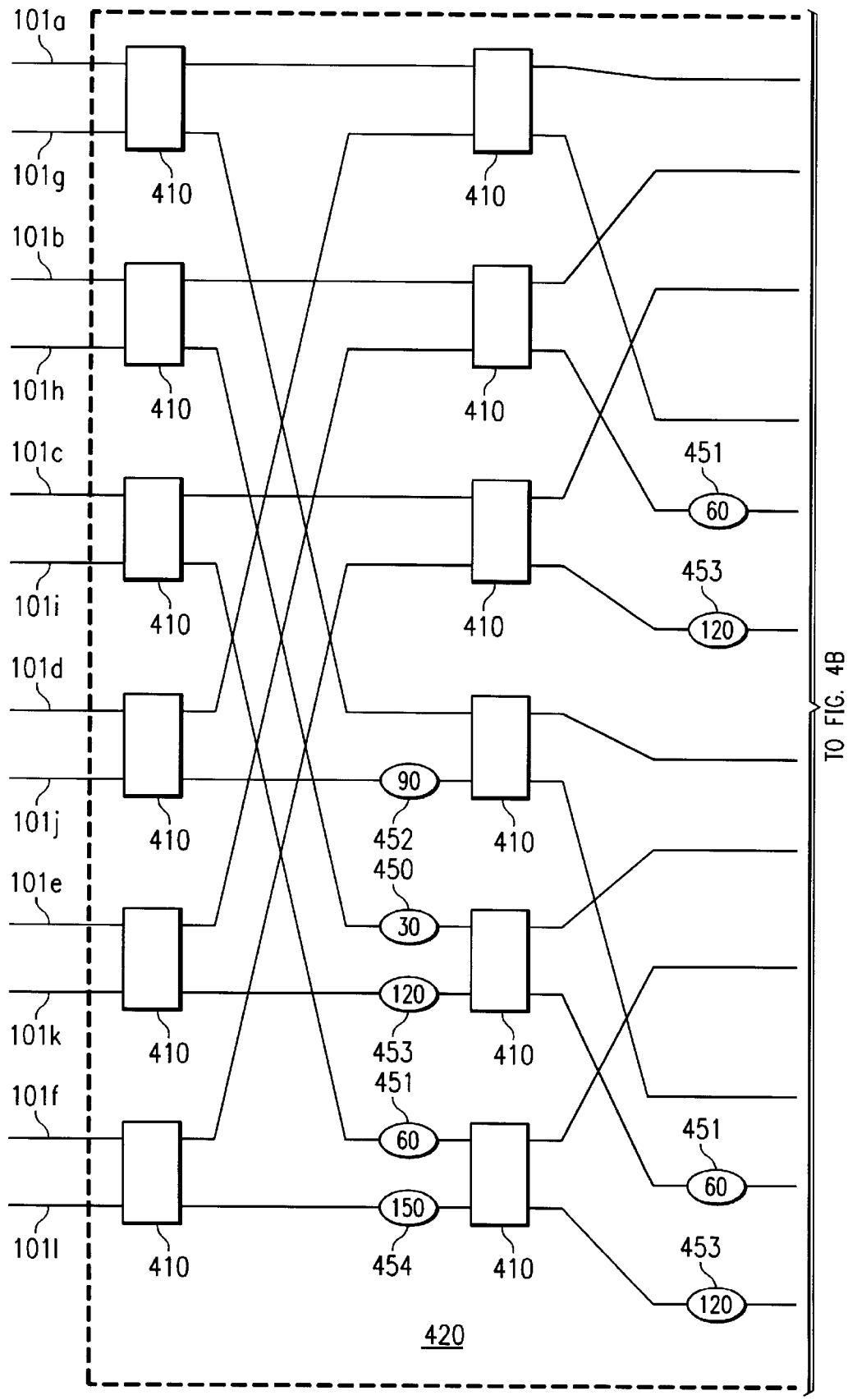
FIGS. 4A through 4D show a preferred embodiment of a 12×12 distributed amplifier of the present invention where
Figure 4B:
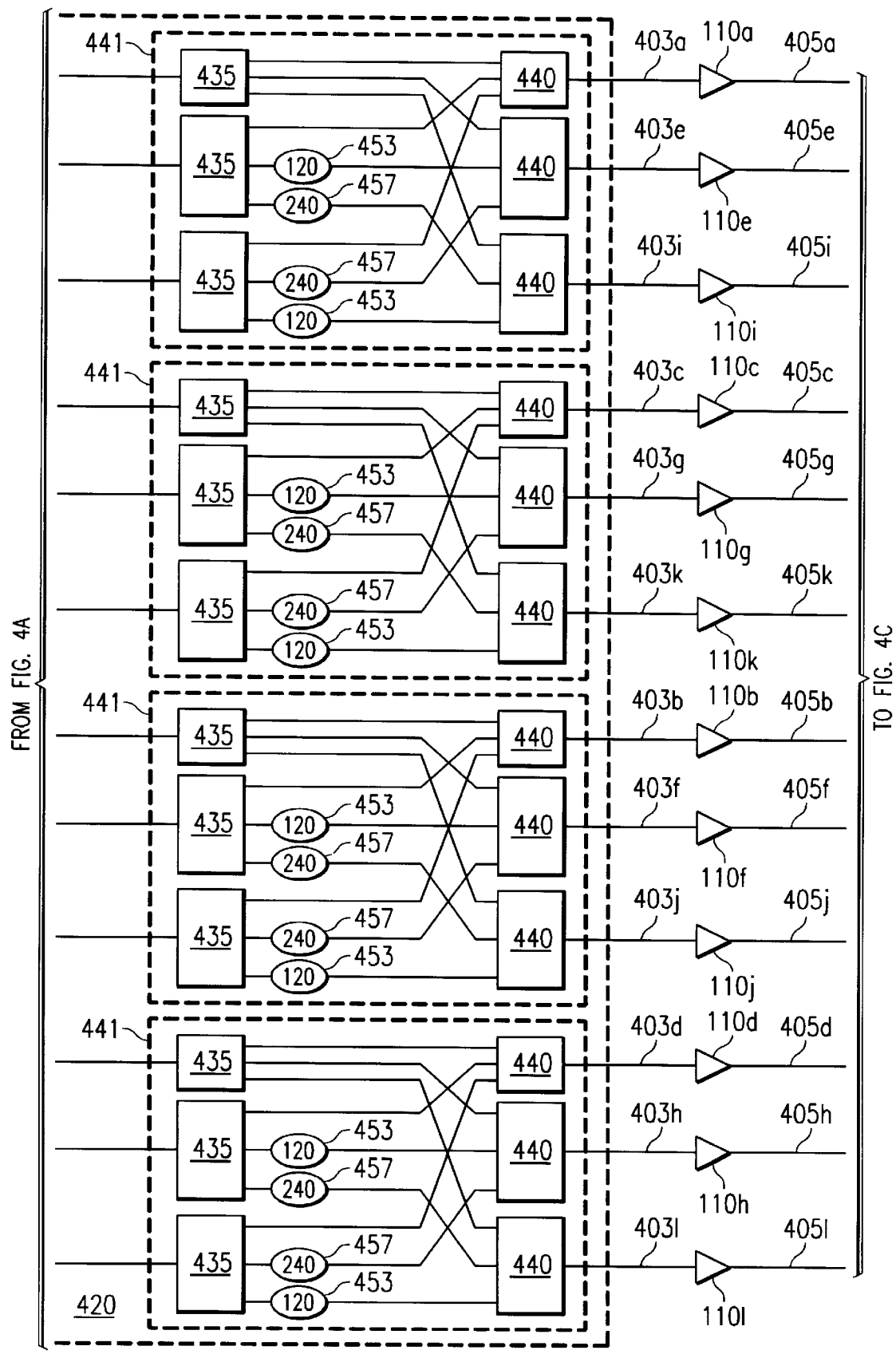
Figure 4C:
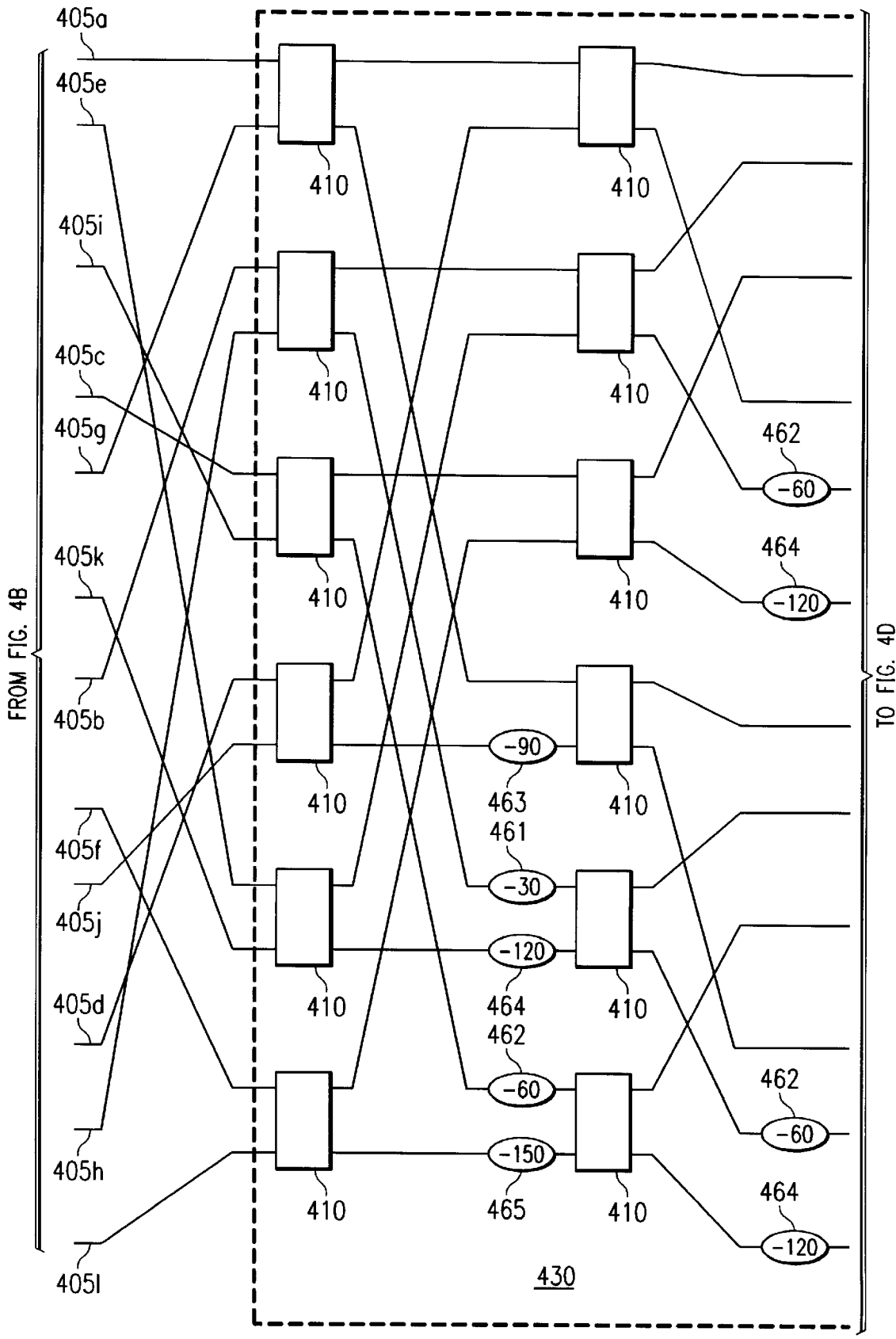
Figure 4D:
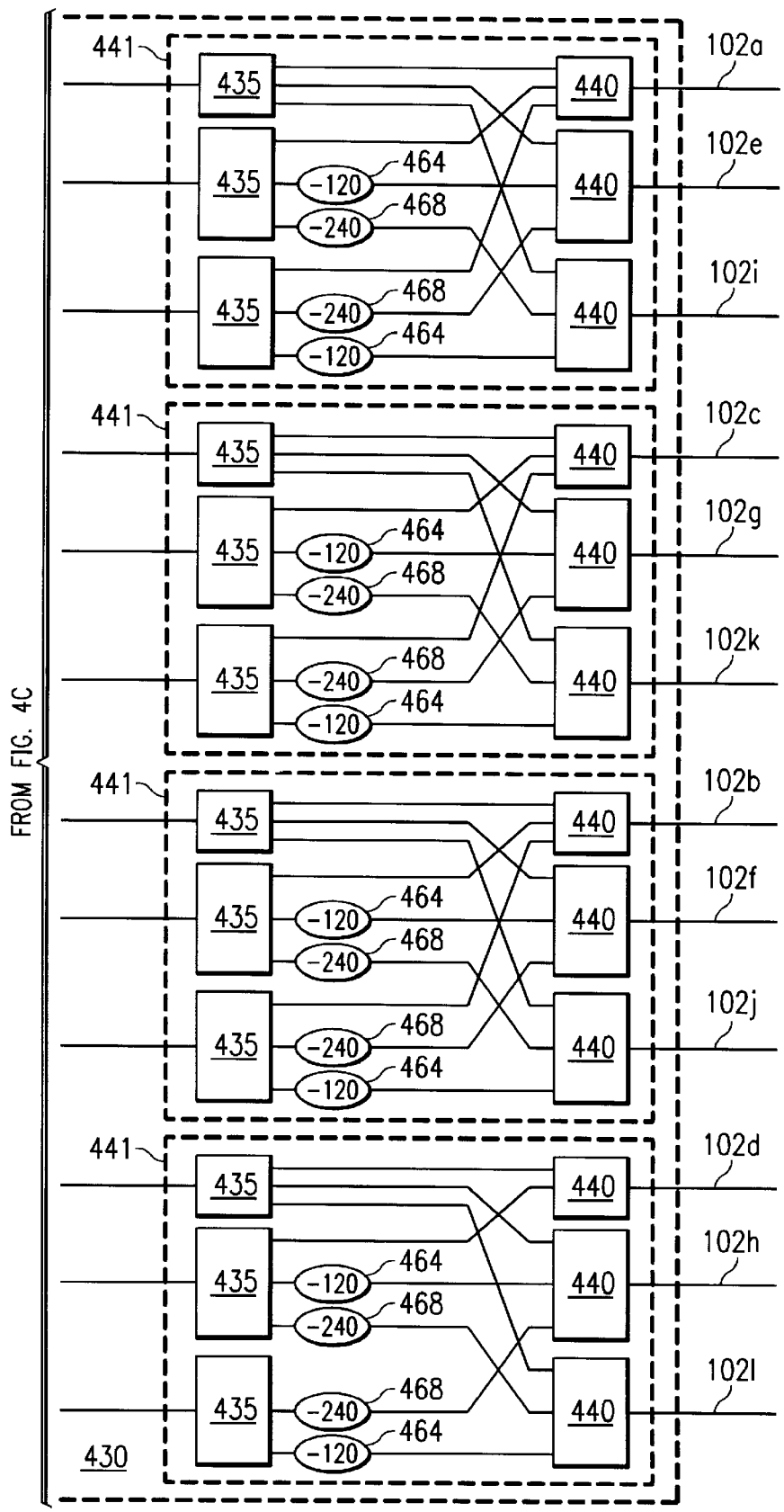

It shall be appreciated that the relationship of prime factors to the preferred embodiment of the present invention can be seen in the input and output matrixes illustrated in FIGS. 4A and 4B. As discussed previously, the input and output matrixes are 12×12. The number 12 is factorable as the prime number 2 times the prime number 2 times the prime number 3 (i.e., 12=(2)(2)(3)). The first stage of the input matrix includes components breaking each input signal down into 2 signal components. Likewise the second stage of the input matrix includes components further breaking down the signal components as 2 signal components. Finally, the third stage of the input matrix, represented here as combiners 441 which include a subcombination of the aforementioned three way splitters and combiners, continues breaking down each of the signal components into 3 signal components. This same relationship of prime factors to the components of the matrix can be seen in output matrix 430.

It shall be appreciated that it is advantageous to provide a first stage of the input/output matrix having components breaking down each input signal into a number of signal components equal to a power of 2 (i.e., $2^1$ as provided above) because this allows the maximum use of standard 2-way combiners. However, it should be understood, according to the present invention, that a first stage breaking down each input signal by a power of 2 is not required. For example, it is possible to place the third stage of the preferred embodiment of FIGS. 4A and 4B as the initial stage of the input and/or output matrix. Of course, the functional distribution and values of phase shifts would change from that illustrated. Likewise, where an odd number of inputs/outputs are desired, for example 15 inputs/outputs, the first stage of the input/output matrixes will necessarily be other than a power of two (i.e., 15 is factorable into the prime numbers 3 and 5 and, according to the preferred embodiment of the present invention, the input stage will break input signals down into either 3 or 5 signal components).

Tracing the interconnections of the components of input matrix 420 and output matrix 430 it can be seen that a signal appearing at input 101*a* will be output at output 102*a*. Furthermore, through signal splitting and cancellation, outputs 102*b*–102*l* will theoretically be devoid of any signal component of the signal appearing at input 101*a*.

In order to more readily see the relationship of the input signals appearing at inputs 101*a*–101*l* to the output signal as appears at outputs 102*a*–102*l*, mathematical expressions for these signals are presented below. The provision of input signal components from input matrix 420 to amplifiers 110*a*–110*l* may be expressed as:

$$g_k(t) = \sum_{i=0}^{11} s_i(t) \varepsilon^{j2\pi i k/12}$$

or, for ease of notation, $$g_k(t) = \sum_{i=0}^{11} s_i(t) L i k 30°$$

Where $S_i(t)$ are input signals $S_0$–$S_{11}$ appearing at inputs 101*a*–101*l* respectively, and $g_k(t)$ are the signal components $g_0$–$g_{11}$ appearing at input matrix 420 outputs 403*a*–403*l* respectively.

The phase relationship of each of the signals ($g_k(t)$) appearing at input matrix 420 outputs 403*a*–403*l* for a signal ($S_i(t)$) appearing at each of the inputs 101*a*–101*l* is shown in the table below:

|        | $s_0(t)$ | $s_1(t)$ | $s_2(t)$ | $s_3(t)$ | $s_4(t)$ | $s_5(t)$ | $s_6(t)$ | $s_7(t)$ | $s_8(t)$ | $s_9(t)$ | $s_{10}(t)$ | $s_{11}(t)$ |
|--------|------|------|------|------|------|------|------|------|------|------|------|------|
| $g_0(t)$ | 0 | 0 | 0 | 0 | 0 | 0 | 0 | 0 | 0 | 0 | 0 | 0 |
| $g_1(t)$ | 0 | 30 | 60 | 90 | 120 | 150 | 180 | 210 | 240 | 270 | 300 | 330 |
| $g_2(t)$ | 0 | 60 | 120 | 180 | 240 | 300 | 0 | 60 | 120 | 180 | 240 | 300 |
| $g_3(t)$ | 0 | 90 | 180 | 270 | 0 | 90 | 180 | 270 | 0 | 90 | 180 | 270 |
| $g_4(t)$ | 0 | 120 | 240 | 0 | 120 | 240 | 0 | 120 | 240 | 0 | 120 | 240 |
| $g_5(t)$ | 0 | 150 | 300 | 90 | 240 | 30 | 180 | 330 | 120 | 270 | 60 | 210 |
| $g_6(t)$ | 0 | 180 | 0 | 180 | 0 | 180 | 0 | 180 | 0 | 180 | 0 | 180 |
| $g_7(t)$ | 0 | 210 | 60 | 270 | 120 | 330 | 180 | 30 | 240 | 90 | 300 | 150 |
| $g_8(t)$ | 0 | 240 | 120 | 0 | 240 | 120 | 0 | 240 | 120 | 0 | 240 | 120 |

-continued

|       | $s_0(t)$ | $s_1(t)$ | $s_2(t)$ | $s_3(t)$ | $s_4(t)$ | $s_5(t)$ | $s_6(t)$ | $s_7(t)$ | $s_8(t)$ | $s_9(t)$ | $s_{10}(t)$ | $s_{11}(t)$ |
|---|---|---|---|---|---|---|---|---|---|---|---|---|
| $g_9(t)$    | 0 | 270 | 180 |  90 |   0 | 270 | 180 |  90 |   0 | 270 | 180 | 90 |
| $g_{10}(t)$ | 0 | 300 | 240 | 180 | 120 |  60 |   0 | 300 | 240 | 180 | 120 | 60 |
| $g_{11}(t)$ | 0 | 330 | 300 | 270 | 240 | 210 | 180 | 150 | 120 |  90 |  60 | 30 |

Recombination of the amplified signal components provided by the output matrix may be expressed as:

$$P_k(t) = \sum_{i=0}^{11} G_i(t)\varepsilon^{-j2\pi ik/12}$$

or, for ease of notation, $$P_k(t) = \sum_{i=0}^{11} G_i(t) \angle -ik30°$$

Where $G_i(t)$ are amplified component signals $G_0$–$G_{11}$ appearing at output matrix inputs 405a–405l respectively, and $P_k(t)$ are recombined output signals $P_0$–$P_{11}$ appearing at outputs 102a–102l respectively.

The phase relationship of each of the signals ($P_k(t)$) appearing at outputs 102a–102l for a signal ($G_i(t)$) appearing at each of the output matrix 430 inputs 405a–405l is shown in the table below:

|          | $G_0(t)$ | $G_1(t)$ | $G_2(t)$ | $G_3(t)$ | $G_4(t)$ | $G_5(t)$ | $G_6(t)$ | $G_7(t)$ | $G_8(t)$ | $G_9(t)$ | $G_{10}(t)$ | $G_{11}(t)$ |
|---|---|---|---|---|---|---|---|---|---|---|---|---|
| $P_0(t)$    | 0 |    0 |    0 |    0 |    0 |    0 |    0 |    0 |    0 |    0 |    0 |    0 |
| $P_1(t)$    | 0 |  -30 |  -60 |  -90 | -120 | -150 | -180 | -210 | -240 | -270 | -300 | -330 |
| $P_2(t)$    | 0 |  -60 | -120 | -180 | -240 | -300 |    0 |  -60 | -120 | -180 | -240 | -300 |
| $P_3(t)$    | 0 |  -90 | -180 | -270 |    0 |  -90 | -180 | -270 |    0 |  -90 | -180 | -270 |
| $P_4(t)$    | 0 | -120 | -240 |    0 | -120 | -240 |    0 | -120 | -240 |    0 | -120 | -240 |
| $P_5(t)$    | 0 | -150 | -300 |  -90 | -240 |  -30 | -180 | -330 | -120 | -270 |  -60 | -210 |
| $P_6(t)$    | 0 | -180 |    0 | -180 |    0 | -180 |    0 | -180 |    0 | -180 |    0 | -180 |
| $P_7(t)$    | 0 | -210 |  -60 | -270 | -120 | -330 | -180 |  -30 | -240 |  -90 | -300 | -150 |
| $P_8(t)$    | 0 | -240 | -120 |    0 | -240 | -120 |    0 | -240 | -120 |    0 | -240 | -120 |
| $P_9(t)$    | 0 | -270 | -180 |  -90 |    0 | -270 | -180 |  -90 |    0 | -270 | -180 |  -90 |
| $P_{10}(t)$ | 0 | -300 | -240 | -180 | -120 |  -60 |    0 | -300 | -240 | -180 | -120 |  -60 |
| $P_{11}(t)$ | 0 | -330 | -300 | -270 | -240 | -210 | -180 | -150 | -120 |  -90 |  -60 |  -30 |

It shall be appreciated that $g_0$–$g_{11}$ as appear in the signal component splitter equations (the first set of equations shown above) and $G_0$–$G_{11}$ as appear in the signal component recombination equations (the second set of equations shown above) are directly related by the gain factor of amplifiers 110a–110l. For example, $g_0$ as used in the splitter equations multiplied by the gain factor of amplifier 110a is equal to $G_0$ as used in the recombination equations.

For simplicity, unity gain may be assumed of all amplifiers 110a–110l and the above equations may be solved to show that the present invention provides a 12×12 square matrix with a diagonal of ones and all other elements zero. Confirmation of the diagonal output matrix may be had through reference to the above tables where it can be seen that the phase relationships of the various signals are such that signal components of a signal appearing at any input 101a–101l are canceled at all but the corresponding output 102a–102l. As such, it shall be appreciated that the present invention provides distributed amplification of twelve input signals by utilizing only twelve amplifiers and yet theoretically very accurately reconstructing the output amplified signal.

As described above, a signal input at any input 101a–101l is provided to each of the twelve available amplifiers. This arrangement provides advantages in that a useful output signal is available even upon failure of an amplifier. For example, failure of amplifier 110a will not cause a signal appearing at input 101a, or any other input for that matter, to cease to be to presented at output 102a. Of course, outputs 102a–102l will experience signal degradation in the form of cross-talk caused by signal components no longer canceling or combining to produce nulls, etc. The theoretical effect of the failure of an amplifier may be calculated using the above equations by removing the signal component associated with the particular amplifier experiencing failure (i.e., remove $G_0$ to simulate a failure of amplifier 110a).

Although the use of each LPA for amplification of any input signal results in cross talk at each of the outputs upon failure of any one of the LPAs, it should be appreciated that the effect on any one output is minimized. Because each LPA is utilized to amplify a portion of each signal, the failure of an LPA results in only that portion of the signal being omitted (or otherwise effected). As such, a trade off exists in that an amplifier failure results in cross-talk experienced at each output port while the power loss of the desired signal is less than where a smaller number of amplifiers are used in the distributed amplification of an input signal.

Figure 3A:
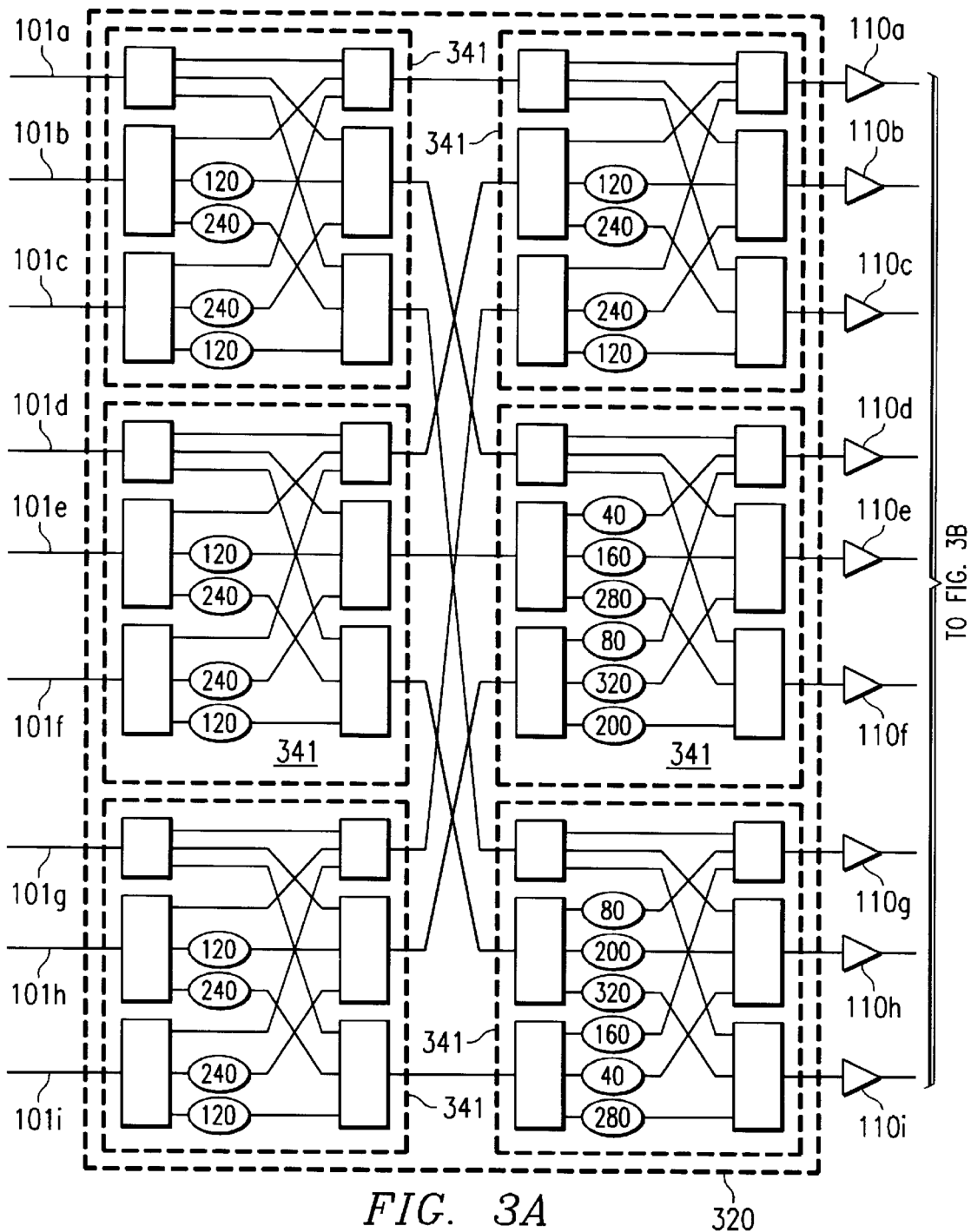
FIGS. 3A and 3B show a preferred embodiment of a 9×9 distributed amplifier of the present invention where
Figure 3B:
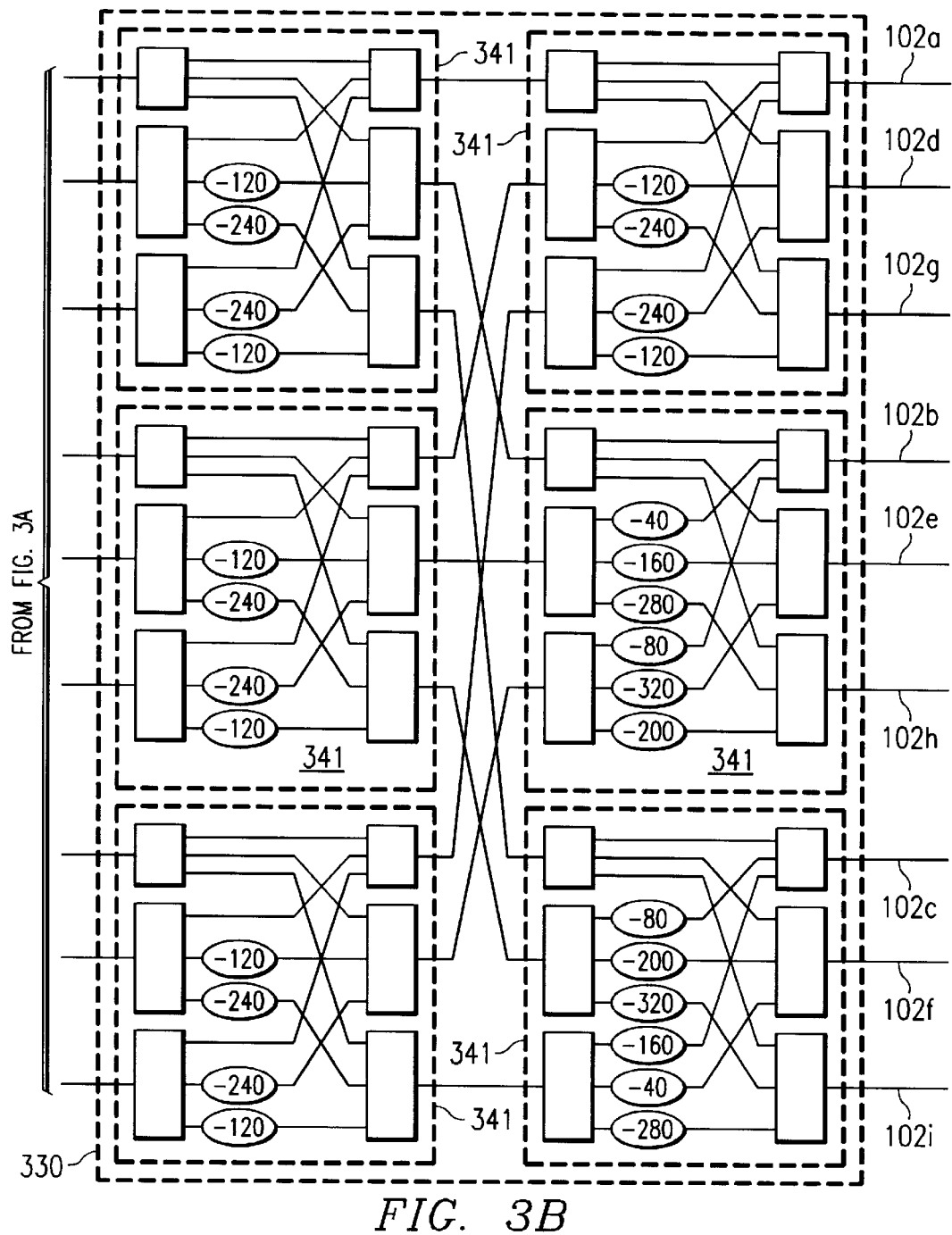

Although the present invention has been discussed with reference to a 12×12 distributed amplifier matrix, it shall be appreciated that the present invention is useful in providing distributed amplification of signals appearing at any number of signal inputs factorable as prime numbers. Although the aforementioned 16×16 back to back matrix provides distributed amplification for a number of signal inputs factorable as prime numbers, it shall be appreciated that the present invention is not limited to powers of two. The present invention may be utilized for a number of signal inputs where one of the prime factors is odd (i.e., inputs numbering 5, 6 or (2)(3), 9 or (3)(3), 10 or (2)(5), 12 or (2)(2)(3), 14 or (2)(7), 15 or (3)(5) . . . ). Directing attention to FIGS. 3A and 3B, the present invention configured to provide a 9×9 distributed amplifier having input matrix 320 and output matrix 330, as shown. Here inputs 101a–101i are amplified by amplifiers 110a–110i for provision to outputs 102a–102i. As above with the inventive 12×12 distributed amplifier, each of amplifiers 110a–101i are utilized for amplification of any particular input signal 101a–101i. It shall be appreciated that the distribution of input signal component is accomplished by two stages of combiners 341. Consistent with the above discussion, combiners 341 have inputs and outputs numbering these, thus, defining two stages corresponding to the prime factors of the number of inputs (9 inputs with two 3×3 stages, i.e., 9 (3)(3)).

It shall be appreciated that, although the present invention has been discussed herein with respect to distributed amplification, the invention is not limited to such applications. Specifically, the present invention may be utilized to distribute, and subsequently recombine, signals for any purpose. For example, the present invention may be utilized to distributively attenuate or filter signals by replacing the aforementioned amplifiers with attenuators or filters. Furthermore, the present invention is not limited to use with a system for providing signals to antennas, and, in fact, may be utilized anywhere distributed signal processing is useful.

Although the present invention and its advantages have been described in detail, it should be understood that various changes, substitutions and alterations can be made herein without departing from the spirit and scope of the invention as defined by the appended claims.

What is claimed is:

1. A distributed signal manipulation system comprising:
    a plurality of input ports, wherein the number of said input ports is a number factorable with prime numbers at least one of which is odd;
    a plurality of output ports equal in number to the number of said input ports;
    means for dividing a signal input at any one of said input ports into a plurality of signal components, wherein said dividing means includes signal dividing stages each stage providing signal division equal to a particular said prime number factor of said input ports, and wherein the final number of signal components of said plurality of signal components is equal to said number of input ports;
    means for combining said plurality of signal components into an output signal, wherein said combining means includes signal combining stages each stage providing signal combining of a number of signal components equal to a particular said prime number factor of said input ports; and
    means located between said signal dividing stages of said dividing means and said signal combining stages of said combining means for shifting a phase of select ones of said signal components.

2. The system of claim 1, further comprising:
    means disposed between said dividing means and said combining means for independently manipulating each of said plurality of signal components.

3. The system of claim 2, wherein said signal manipulation means comprises:
    at least one amplifier, and wherein said output signal includes an amplified aspect of said input signal.

4. The system of claim 3, wherein the number of said linear power amplifiers is equal to said number of input ports of said plurality of input ports.

5. The system of claim 1, wherein said phase shifting means introduces signal component phase shifts asymmetrically with respect to said dividing means and said combining means.

6. The system of claim 1, wherein said phase shifting means comprises phase shifters selected from the group consisting of:
    a mechanical phase shifter;
    a surface acoustic wave device;
    a ferrite phase shifter;
    a semiconductor device phase shifter;
    an active FET phase shifter; and
    a bulk semiconductor phase shifter.

7. The system of claim 1, wherein at least one stage of said dividing means comprises a plurality of signal splitters which do not introduce a phase shift into at least one signal.

8. The system of claim 7, wherein at least one stage of said dividing means comprises a plurality of 180° hybrid combiners.

9. The system of claim 1, wherein at least one stage of said combining means comprises a plurality of signal combiners which do not introduce a phase shift into at least one combined signal.

10. The system of claim 9, wherein at least one stage of said combining means comprises a plurality of 180° hybrid combiners.

11. The system of claim 1, wherein said number of said plurality of input ports is selected from the group consisting of three, five, six, nine, ten, twelve, fourteen, and fifteen.

12. A method for providing distributed signal manipulation, said method comprising the steps of:
    selecting a number of discrete signals for which to provide said distributed signal manipulation, wherein said number selected may be any number factorable by prime numbers including at least one odd number;
    providing a plurality of input ports, wherein the number of said input ports is said number selected in said selecting step;
    providing a plurality of output ports, wherein the number of said output ports is the same number as said number of input ports;
    dividing a signal input at any of said input ports into a plurality of signal components, wherein said dividing step includes signal dividing substeps each dividing signals into a number of components equal to a particular said prime number factor of said input ports, and wherein the final number of signal components of said plurality of signal components is equal to said number of input ports; and
    recombining said plurality of signal components into an output signal, wherein said recombining step includes signal combining substeps each combining a number of signal components together equal to a particular said prime number factor.

13. The method of claim 12, further comprising the step of:
    shifting a phase of select ones of said signal components independent of said splitting and combining substeps.

14. The method of claim 13, wherein said phase shifting step utilizes a device selected from the group consisting of:
    a predetermined length of signal path;
    a circular coupled circuit;

a hybrid coupled circuit;

a surface acoustic wave device;

a ferrite phase shifter;

a semiconductor device; and a field effect transistor.

15. The method of claim 12, further comprising the step of:

manipulating said plurality of signal components prior to said recombining step.

16. The method of claim 15, wherein said manipulating step comprises the step of amplifying said signal components.

17. The method of claim 16, wherein said manipulating step utilizes a plurality of amplifiers, wherein the number of amplifiers in said plurality of amplifiers is equal to said number of input ports provided in said providing step.

18. The method of claim 12, wherein at least one of said dividing substeps comprises the step of:

splitting a signal without introducing a phase difference into any resulting split signal.

19. The method of claim 18, wherein at least one of said dividing substeps comprises the step of:

splitting a signal and introducing a phase difference into at least one resulting split signal, wherein said phase difference is substantially 180°.

20. The method of claim 12, wherein at least one of said combining substeps comprises the step of:

combining at least two signals without introducing a phase difference into any of said combined split signal.

21. The method of claim 20, wherein at least one of said combining substeps comprises the step of:

combining at least two signals and introducing a phase difference into at least one of said combined signal, wherein said phase difference is substantially 180°.

22. A system providing distributed manipulation of an input signal applied to a signal input port of a plurality of signal input ports to result in an output signal having a predetermined manipulated aspect at a particular signal output port of a plurality of signal output ports corresponding to said signal input port, said system comprising:

an input signal path matrix providing said plurality of signal input ports and a plurality of distributed signal output ports, wherein the number of said distributed signal output ports is factorable as prime numbers including at least one odd number, and wherein at least a portion of said input signal is provided to each of said plurality of distributed signal output ports.

23. The system of claim 22, further comprising:

an output signal path matrix providing said plurality of signal output ports and a plurality of distributed signal input ports, wherein the number of said distributed signal input ports is the same as said number of distributed signal output ports, and wherein signals applied to ones of said distributed signal input ports are combined to provide said output signal to said particular output port.

24. The system of claim 22, wherein said input signal path matrix comprises:

a plurality of signal splitting devices; and a plurality of signal phase adjusting devices independent of any of said signal splitting devices.

25. The system of claim 24, wherein said plurality of said signal splitting devices of said input signal path matrix comprise:

at least one hybrid signal splitter; and at least one signal splitter which does not introduce a phase shift into at least one split signal.

26. The system of claim 22, wherein said number of signal input ports is twelve.

27. A system providing distributed manipulation of an input signal applied to a signal input port of a plurality of signal input ports to result in an output signal having a predetermined manipulated aspect at a particular signal output port of a plurality of signal output ports corresponding to said signal input port, said system comprising:

an output signal path matrix providing said plurality of signal output ports and a plurality of distributed signal input ports, wherein the number of said distributed signal input ports is factorable as prime numbers including at least one odd number, and wherein signals applied to ones of said distributed signal input ports are combined to provide said output signal to said particular output port.

28. The system of claim 27, wherein said output signal path matrix comprises:

a plurality of signal combining devices; and a plurality of signal phase adjusting devices independent of any of said signal combining devices.

29. The system of claim 28, wherein said plurality of said signal combining devices of said output signal path matrix comprise:

at least one hybrid signal combiner; and at least one signal combiner which does not introduce a phase shift into at least one combined signal.

30. The system of claim 27, wherein said number of signal output ports is twelve.

31. A system providing distributed manipulation of an input signal applied to a signal input port of a plurality of signal input ports to result in an output signal having a predetermined manipulated aspect at a particular signal output port of a plurality of signal output ports corresponding to said signal input port, said system comprising:

an input signal path matrix providing said plurality of signal input ports and a plurality of distributed signal output ports, wherein the number of said distributed signal output ports is factorable as prime numbers including at least one odd number, and wherein at least a portion of said input signal is provided to each of said plurality of distributed signal output ports;

an output signal path matrix providing said plurality of signal output ports and a plurality of distributed signal input ports, wherein the number of said distributed signal input ports is the same as said number of distributed signal output ports, and wherein signals applied to ones of said distributed signal input ports are combined to provide said output signal to said particular output port; and a plurality of signal manipulation devices wherein the number of said signal manipulation devices is the same as said number of distributed signal output ports, coupled to said input signal path matrix and said output signal path matrix providing manipulation of signals appearing at ones of said plurality of distributed signal output ports of the input signal path matrix for input into ones of said plurality of distributed signal input ports of the output signal path matrix.

32. The system of claim 31, wherein each of said input signal path matrix and said output signal path matrix comprises:

a plurality of signal splitting and combining devices; and a plurality of signal phase adjusting devices independent of any of said signal splitting and combining devices.

33. The system of claim 32, wherein ones of said plurality of signal phase adjusting devices of said input signal path matrix arc disposed at different points of said input signal path matrix than are ones of said plurality of signal phase adjusting devices of said output signal path matrix.

34. The system of claim 32, wherein said plurality of said signal splitting and combining devices of each of said input signal path matrix and said output signal path matrix each comprise:

at least one hybrid signal combiner; and at least one signal combiner which does not introduce a phase shift into at least one combined signal.

35. The system of claim 34, wherein said last mentioned combiner is a Wilkinson combiner.

36. The system of claim 31, wherein one of said signal manipulation devices comprise linear power amplifiers, and wherein said output signal is an amplified rendition of said input signal.

37. The system of claim 31, wherein said number of signal input ports is twelve.

38. A system providing distributed manipulation of an input signal applied to a signal input port of a set of twelve signal input ports to result in an output signal having an amplified version of said input signal at a particular signal output port of a set of twelve signal output ports corresponding to said signal input port, said system comprising:

an input signal path matrix providing said set of twelve signal input ports and a set of twelve distributed signal output ports, wherein at least a portion of said input signal is provided to each one of said twelve distributed signal output ports, and wherein said input signal path matrix comprises:

a plurality of signal splitting devices, said plurality of splitting devices including at least one hybrid combiner and at least one splitter which does not introduce a phase shift into at least one signal; and a plurality of signal phase adjusting devices operable with said signal splitting devices; and an output signal path matrix providing said set of twelve signal output ports and a set of twelve distributed signal input ports, wherein signals applied to each of said distributed signal input ports are combined to provide said output signal, and wherein said output signal path matrix comprises:

a plurality of signal combining devices, said plurality of combining devices including at least one hybrid combiner and at least one combiner which does not introduce a phase shift into at least one combined signal; and a plurality of signal phase adjusting devices operable with said signal combining devices.

39. The system of claim 38, further comprising:

a plurality of amplifiers coupled between said input signal path matrix and said output signal path matrix providing amplification of signals appearing at said distributed signal output ports for input into said plurality of distributed signal input ports.

40. The system of claim 38, wherein said at least one hybrid combiner of said input signal path matrix is a 180° hybrid combiner.

41. The system of claim 38, wherein said at least one hybrid combiner of said output signal path matrix is a 180° hybrid combiner.

42. The system of claim 38, wherein at least one of said input signal path matrix and said output signal path matrix include three stages of signal splitting/combining.

43. The system of claim 42, wherein said three stages comprise:

a first stage having a plurality of said hybrid signal combiners;

a second stage having a plurality of said hybrid signal combiners; and a third stage having a plurality of said signal splitters/combiners which do not introduce a phase shift into at least one signal.

44. The system of claim 43, wherein said third stage comprises:

at least one pair of said splitters/combiners having a ratio of three to one with respect to a number of inputs and outputs.

45. A method for providing distributed signal manipulation, said method comprising the steps of:

selecting a number of discrete signals for which to provide said distributed signal manipulation, wherein said number selected may be any number factorable by prime numbers including at least one odd number;

providing a plurality of input ports, wherein the number of said input ports is equal to said number selected in said selecting step;

providing a plurality of output ports, wherein the number of said output ports is the same number as said number of input ports;

dividing a signal input at any of said input ports into a plurality of signal components, wherein said dividing step includes signal dividing substeps each substep dividing signals into a number of components equal to a particular said prime number factor of said input ports, wherein the final number of signal components of said input signal is equal to said number of input ports, and wherein at least one of said dividing substeps comprises the step of splitting a signal without introducing a phase difference into any resulting split signal; and recombining said plurality of signal components into an output signal, wherein said recombining step includes signal combining substeps each substep combining a number of signal components equal to a particular said prime number factor.

46. The method of claim 45, wherein at least one of said signal combining substeps comprises the step of:

combining at least two signals without introducing a phase difference into any of said combined split signal.

47. The method of claim 45, wherein at least one of said dividing substeps comprises the step of:

splitting a signal and introducing a phase difference into at least one resulting split signal, wherein said phase difference is substantially 180°.

48. A system providing distributed manipulation of an input signal applied to a signal input port of a plurality of signal input ports to result in an output signal having a predetermined manipulated aspect at a particular signal output port of a plurality of signal output ports corresponding to said signal input port, said system comprising:

an input signal path matrix providing said plurality of signal input ports and a plurality of distributed signal output ports, wherein the number of said distributed signal output ports is factorable as prime numbers including at least one odd number, wherein at least a portion of said input signal is provided to each of said plurality of distributed signal output ports, wherein said input signal path matrix comprises:

a plurality of signal splitting devices; and a plurality of signal phase adjusting devices independent of any of said signal splitting devices.

49. The system of claim 48, further comprising:

an output signal path matrix providing a plurality of signal output ports and a plurality of distributed signal input ports, wherein the number of said distributed signal input ports is the same as said number of distributed signal output ports, wherein signals applied to ones of said distributed signal input ports are combined to provide said output signal to said particular output port, and wherein said output signal path matrix comprises:

a plurality of signal splitting and combining devices; and a plurality of signal phase adjusting devices independent of any of said signal splitting and combining devices, wherein ones of said plurality of signal phase adjusting devices of said input signal path matrix are disposed at different points of said input signal path matrix than are ones of said plurality of signal phase adjusting devices of said output signal path matrix.

50. The system of claim 1, wherein said phase shifting means introduces asymmetrical phase shifts in the signal components of said dividing means and said combining means.

51. The system of claim 1, wherein a signal path of said dividing means is not the inverse of a signal path of said combining means.

52. The system of claim 23, wherein said input signal path matrix and said output signal path matrix are not the inverse of each other.

53. The system of claim 31, wherein said input signal path matrix is not the inverse of said output signal path matrix.

54. The system of claim 38, wherein said output signal path matrix is not the inverse of said input signal path matrix.

* * * * *